(12) United States Patent
Huang et al.

(10) Patent No.: US 11,380,639 B2
(45) Date of Patent: Jul. 5, 2022

(54) SHIELDING STRUCTURES

(71) Applicant: Taiwan Semiconductor Manufacturing Co., Ltd., Hsinchu (TW)

(72) Inventors: Chih-Fan Huang, Kaohsiung (TW); Hui-Chi Chen, Hsinchu County (TW); Kuo-Chin Chang, Chiayi (TW); Chien-Huang Yeh, Hsinchu (TW); Hong-Seng Shue, Hsinchu County (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 24 days.

(21) Appl. No.: 17/114,112

(22) Filed: Dec. 7, 2020

(65) Prior Publication Data

US 2021/0091029 A1 Mar. 25, 2021

Related U.S. Application Data

(63) Continuation of application No. 16/392,024, filed on Apr. 23, 2019, now Pat. No. 10,861,810.
(Continued)

(51) Int. Cl.
*H01L 23/00* (2006.01)
*H01L 21/48* (2006.01)

(52) U.S. Cl.
CPC .......... *H01L 24/06* (2013.01); *H01L 21/4814* (2013.01); *H01L 24/05* (2013.01);
(Continued)

(58) Field of Classification Search
CPC . H01L 21/48; H01L 21/4814; H01L 21/4846; H01L 21/4853; H01L 21/50;
(Continued)

(56) References Cited

U.S. PATENT DOCUMENTS

| 9,000,584 B2 | 4/2015 | Lin et al. |
| 9,048,222 B2 | 6/2015 | Hung et al. |

(Continued)

FOREIGN PATENT DOCUMENTS

| CN | 101208789 A | 10/2009 |
| CN | 105810669 A | 7/2016 |

(Continued)

*Primary Examiner* — Cheung Lee
(74) *Attorney, Agent, or Firm* — Haynes and Boone, LLP

(57) ABSTRACT

Semiconductor device packages and method are provided. A semiconductor device package according to the present disclosure includes a substrate including a first region, a passive device disposed over the first region of the substrate, a contact pad disposed over the passive device, a passivation layer disposed over the contact pad, a recess through the passivation layer, and an under-bump metallization (UBM) layer. The recess exposes the contact pad and the UBM layer includes an upper portion disposed over the passivation layer and a lower portion disposed over a sidewall of the recess. A projection of the upper portion of the UBM layer along a direction perpendicular to the substrate falls within an area of the contact pad.

20 Claims, 9 Drawing Sheets

Fig. 10

Related U.S. Application Data

(60) Provisional application No. 62/771,691, filed on Nov. 27, 2018.

(52) U.S. Cl.
CPC ............. *H01L 24/10* (2013.01); *H01L 24/13* (2013.01); *H01L 24/16* (2013.01); *H01L 2224/0401* (2013.01); *H01L 2224/05005* (2013.01); *H01L 2224/05008* (2013.01); *H01L 2224/05015* (2013.01); *H01L 2224/05555* (2013.01); *H01L 2224/0603* (2013.01); *H01L 2224/16227* (2013.01)

(58) Field of Classification Search
CPC ......... H01L 23/12; H01L 23/13; H01L 23/14; H01L 23/48; H01L 23/52; H01L 23/522; H01L 23/538; H01L 24/02; H01L 24/04; H01L 24/05; H01L 24/06; H01L 24/07; H01L 24/10; H01L 24/11; H01L 24/12; H01L 24/13; H01L 24/15; H01L 24/16; H01L 24/80; H01L 24/81; H01L 2224/0401; H01L 2224/05005; H01L 2224/05008; H01L 2224/05015; H01L 2224/05555; H01L 2224/06303; H01L 2224/16227

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2010/0164079 | A1 | 7/2010 | Dekker et al. |
| 2011/0108950 | A1 | 5/2011 | Jou et al. |
| 2016/0133686 | A1 | 5/2016 | Liao et al. |

FOREIGN PATENT DOCUMENTS

| | | |
|---|---|---|
| JP | 2006294656 A | 10/2006 |
| JP | 2008010778 A | 1/2008 |
| KR | 20080021703 A | 3/2008 |
| KR | 20160089883 A | 7/2016 |

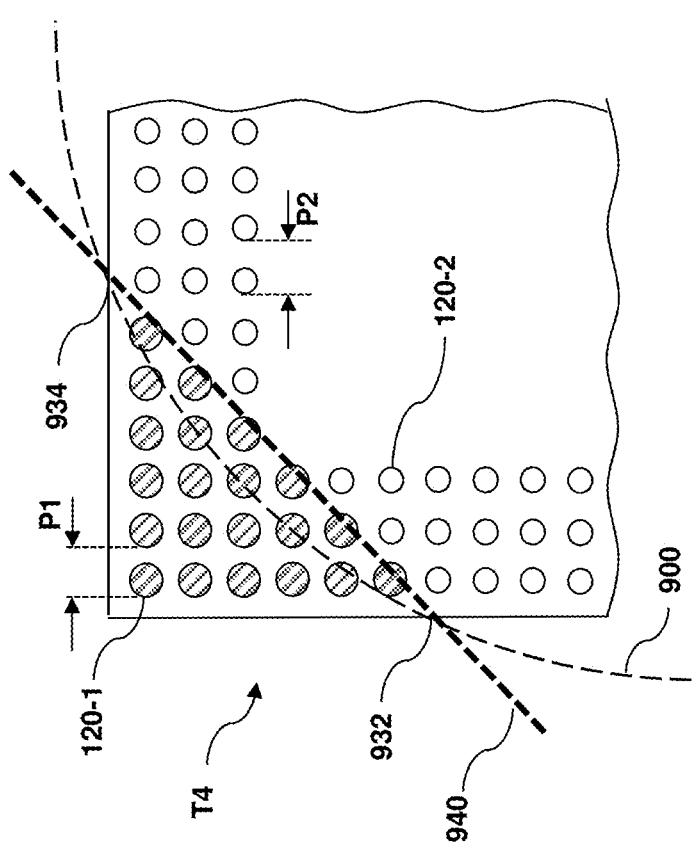

SHIELDING STRUCTURES

PRIORITY DATA

This application is a continuation application of U.S. patent application Ser. No. 16/392,024, filed Apr. 23, 2019, which claims priority to U.S. Provisional Patent Application Ser. No. 62/771,691, filed Nov. 27, 2018, each of which is hereby incorporated herein by reference in its entirety.

BACKGROUND

In semiconductor industry, integrated circuits (ICs) are formed on a semiconductor substrate and thereafter saw into IC dies. One or more IC chips are then packaged and encapsulated into semiconductor device packages or IC packages. Device packages are further bonded to a circuit board, such as a printed circuit board (PCB) in electric products. In previous generations of technologies, various bonding pads of the device package are connected to the circuit board through wire bonding. In advanced technologies, bumps are formed on a device package and the device package is flipped over and directly bonded to the circuit board for reduced cost. In this technology, one or more passivation layers are formed to protect the integrated circuits. A redistribution layer of conductive metal lines is formed on the IC die to reroute bond connections from the edge to the center of the device package. The redistribution layer is embedded in the passivation layer. Bonding pads are formed to electrically connect various devices through the redistribution layer and an interconnection structure to form the integrated circuit. The existing packaging structures are not satisfactory in all aspects. Therefore, the present disclosure provides a packaging structure and a method of making the same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 10 is an enlarged top view of a corner of a semiconductor device package having two types of contact pads deployed according to the method in FIGS. 8 and 9.

DETAILED DESCRIPTION

Figure 2:
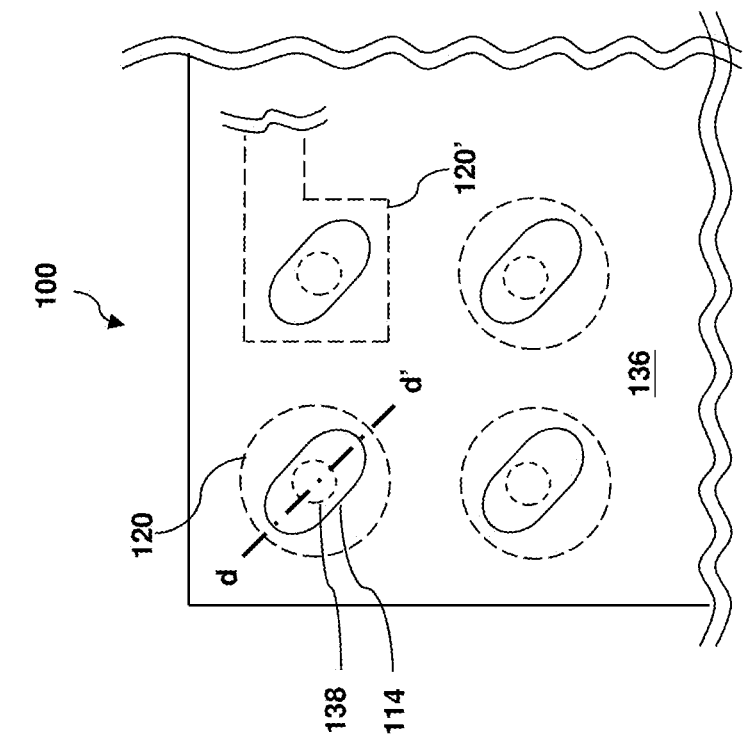
FIG. 2 is an enlarged top view of a corner of the semiconductor device package of FIG. 1 according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

A semiconductor structure according embodiments of the present disclosure may include a redistribution layer (RDL) structure over a device, such as an MIM/MOM capacitor. A top metal layer in the RDL structure may serve as a contact pad to be electrically coupled to an under-bump metallization (or under bump metallurgies, UBM) feature formed over the top metal layer. The UBM feature may include an upper portion and a lower portion. The upper portion is disposed over a passivation layer, such as a polyimide (PI) layer. The lower portion is formed conformally along sidewalls of a recess in the passivation layer. The upper portion is larger than the lower portion in terms of area. The top metal layer of the RDL structure may include, within its surface area, a circular area having a radius R, measured from a center of the recess. The upper portion of the UBM layer may have a circular shape, an oval shape or a shape of a race track, which may be characterized by a maximum radius A and a minimum radius B, both measured from the center of the recess to an edge of the upper portion of the UBM feature. In some embodiments of the present disclosure, R is between the summation of A and B (i.e. (A+B)) and one half of the summation of A and B (i.e. (A+B)/2).

A semiconductor device package, which includes semiconductor materials, oxides, and nitrides, tends to have a lower coefficient of thermal expansion (CTE) than that of a substrate that is made of metal and/or polymer. An example of such substrate is a printed circuit board (PCB). After a semiconductor device package is bonded to a PCB via bump features formed over UBM layers on the semiconductor device package, thermal cycles may cause the semiconductor device package and the PCB to expand differently, resulting in stress around the UBM layers. Such stress may be mild around a center of the semiconductor device package and gradually become stronger toward edges of the semiconductor device package. The stress around edges of the semiconductor device package can result in cracks in the semiconductor device package around or below the UBM layers. The stress at the edge of the semiconductor device package may also increase with the size of the semiconductor device package. In some instances, the stress is particularly significant when an area of the semiconductor device package is greater than about 500 mm$^2$. In some instances, the resultant cracks may penetrate devices, such as metal-insulator-metal (MIM) or metal-oxide-metal (MOM) capacitors, under or around the UBM features, causing such devices to fail. When the top metal layer (or contact pad) of the RDL structure and the UMB feature are arranged according to embodiments of the present disclosure, the larger top metal layer or the contact pad may shield stress from the device and prevent cracks from propagating through layers that form the device, thereby preventing failures thereof. In addition, such top metal layer (or contact pad) would not be too large to impact metal routing in the RDL structure.

Figure 1:
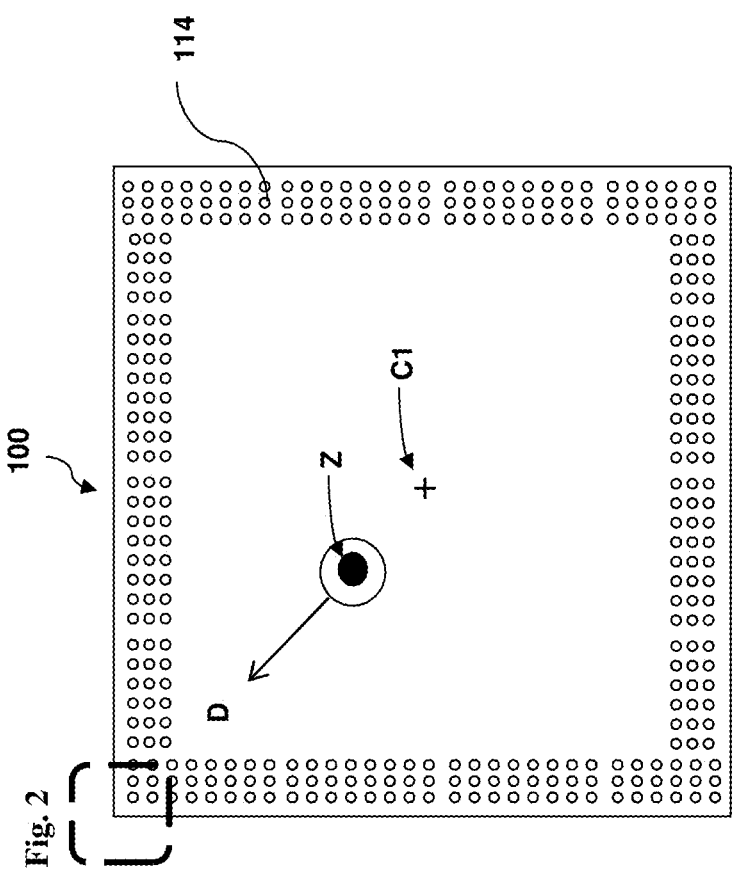
FIG. 1 is a bump-side top view of a semiconductor device package according to various aspects of the present disclosure.

FIG. 1 illustrates a top view of a semiconductor device package 100 from the side on which bump features on formed (the "bump-side"), according to some embodiments of the present disclosure. The semiconductor device package 100 shown in FIG. 1 is rectangular from the top view. In some embodiments, the semiconductor device package 100 includes solder feature 114 around edges and corners of the semiconductor device package 100. For purpose of the present disclosure, being around an edge or a corner of the semiconductor device package 100 may mean being within a region of the semiconductor device package 100 that is closer to the edge or corner than to a geometric center "C1" of the semiconductor device package 100. It is noted, however, that the embodiments in the present disclosure are not so limited. Semiconductor device packages according to embodiments of the present disclosure may have shapes other than a rectangle and may include solder features 114 in areas other than the edge and corner regions, such as the center of the rectangular semiconductor device package 100. The rectangular shape of the semiconductor device package 100 includes the geometric center "C1," which may coincide with the weight/mass center of the semiconductor device package 100 when the semiconductor device package 100 has a uniform distribution of weight/mass across the semiconductor device package 100. A diagonal direction from the geometric center C1 toward a corner of the semiconductor device package 100 is denoted as D direction. A direction perpendicular or normal to a main surface of the semiconductor device package 100 is denoted as Z direction. In FIG. 1, only one D direction is shown. However, there may be four D directions extending from the center C1 to four corners of the semiconductor device package 100 when the semiconductor device package 100 is rectangular from the top view. A corner of the semiconductor device package 100 is enlarged and illustrated in FIG. 2.

Referring now to FIG. 2, shown therein are four solder features 114 at a corner of the semiconductor device package 100. As will be described below, a solder feature 114 is disposed over a bump feature 112 (not visible in FIG. 2 but shown in FIG. 3) and the bump feature 112 is electrically coupled to a contact pad 120 (or metal pad, shown in dotted lines) via a recess 138 (shown in dotted lines) through a polymeric passivation layer 136. The solder feature 114, along with the bump feature 112, protrude above a top surface of the polymeric passivation layer 136. A peripheral portion of the contact pad 120 is under the polymeric passivation layer 136 and a center portion of the contact pad 120 is exposed through the recess 138 in the polymeric passivation layer 136 and is under the bump feature 112 and the solder feature 114. While the contact pad 120 shown in FIG. 2 is circular, the contact pad 120 may be of any suitable shape, such as a rectangular shape shown as contact pad 120'. Additionally, the contact pad 120 may be physically and electrically connected to a conductive feature thereunder, such as a metal line in another RDL layer or a connector/contact to a passive device (such as device 300, to be described below), through a via or to a metal line in the same RDL layer. In some embodiments, the solder feature 114 and the bump feature 112 thereunder may be circular or oval from a top view or have a shape of a racetrack, as is illustrated in FIG. 2, for example. In some embodiments, the bump feature 112 may be elongated along the D direction to have an oval shape or a racetrack shape to prevent concentration of stress and to improve yield. The solder feature 114 is formed on the bump feature 112 and generally tracks the top-view profile of the bump feature 112. For example, when the bump feature 112 has a racetrack (or racetrack-like) shape from a top view, the solder feature 114 has a similar racetrack (or racetrack-like) shape from the top view as well.

Figure 3:
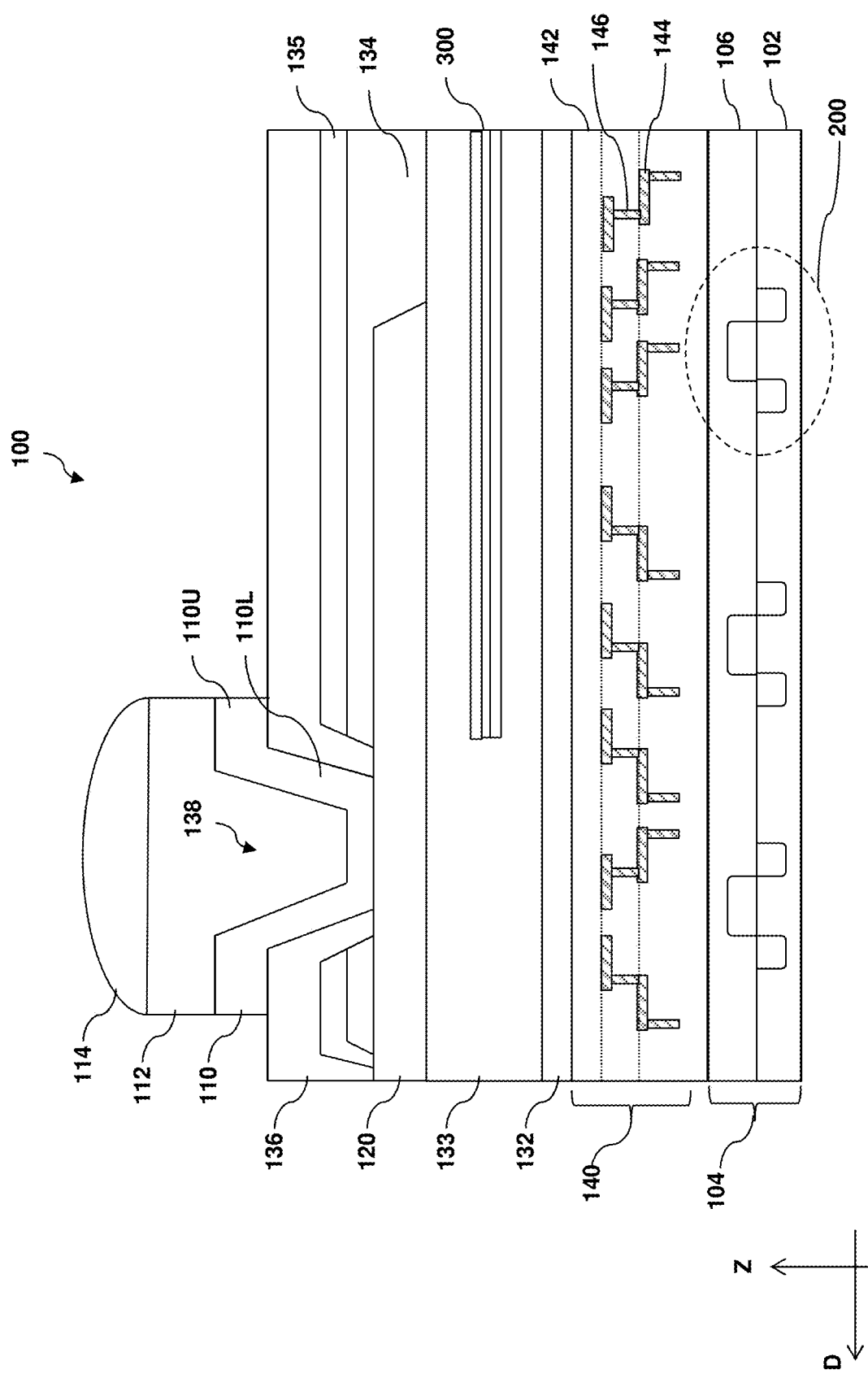
FIG. 3 is a cross-sectional view of the semiconductor device package of FIG. 2 along direction d-d', according to various aspects of the present disclosure.

FIG. 3 illustrates a cross-sectional view of the semiconductor device package 100 across a line d-d' along the D direction. In accordance with some embodiments of the present disclosure, the semiconductor device package 100 includes an IC die 104, which may include devices 200. Devices 200 may be active devices such as transistors and/or diodes, and possibly passive devices such as capacitors, inductors, resistors, or the like. In some instances, the semiconductor device package 100 may include a plurality of IC dies, with a portion of one such IC die 104 shown in FIG. 3. In accordance with some embodiments of the present disclosure, the IC die 104 is a logic die, which may be a Central Processing Unit (CPU) die, a Micro Control Unit (MCU) die, an input-output (IO) die, a BaseBand (BB) die, an Application processor (AP) die, or the like. The IC die 104 may also be a memory die such as a Dynamic Random Access Memory (DRAM) die or a Static Random Access Memory (SRAM) die, or may be other types of dies. The embodiments of the present disclosure may also be applied to other types of package components such as interposer wafers.

In accordance with some embodiments of the present disclosure, the IC die 104 is fabricated on a substrate 102, such as a semiconductor substrate 102 shown in FIG. 3. Semiconductor substrate 102 may be formed of crystalline silicon, crystalline germanium, crystalline silicon germanium, and/or a III-V compound semiconductor such as GaAsP, AlInAs, AlGaAs, GaInAs, GaInP, GaInAsP, or the like. Semiconductor substrate 102 may also be a bulk silicon substrate or a Silicon-On-Insulator (SOI) substrate. Shallow Trench Isolation (STI) regions (not shown) may be formed in semiconductor substrate 102 to isolate the active regions in semiconductor substrate 102. Although not shown, through-vias may be formed to extend into semiconductor substrate 102, and the through-vias are used to electrically inter-couple the features on opposite sides of IC die 104.

In accordance with some embodiments of the present disclosure, the IC die 104 includes devices 200, which are formed on the top surface of semiconductor substrate 102. Exemplary devices 200 may include Complementary Metal-Oxide Semiconductor (CMOS) transistors, resistors, capacitors, diodes, and/or the like. The details of devices 200 either not illustrated or not illustrated in full herein. In accordance with alternative embodiments, IC die 104 is used for forming interposers, in which semiconductor substrate 102 may be a semiconductor substrate or a dielectric substrate.

Inter-Layer Dielectric (ILD) 106 is formed over semiconductor substrate 102, and fills the space between the gate stacks of transistors (not shown) in devices 200 or generally the space between devices on the semiconductor substrate 102. In accordance with some exemplary embodiments, ILD 106 is formed of Phosphosilicate Glass (PSG), Borosilicate Glass (BSG), Boron-Doped Phosphosilicate Glass (BPSG), Fluorine-Doped Silicate Glass (FSG), Tetra Ethyl Ortho Silicate (TEOS), or the like. ILD 106 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs (not shown) may be formed in ILD 106, and are used to electrically connect devices 200 to overlying metal lines 144 and vias 146. In accordance with some embodiments of the present disclosure, contact plugs are formed of a conductive material selected from tungsten, aluminum, copper, titanium, tantalum, titanium nitride, tantalum nitride, alloys thereof, and/or multi-layers thereof. The formation of contact plugs may include forming contact openings in ILD 106, filling a conductive material(s) into the contact openings, and performing a planarization (such as Chemical Mechanical Polish (CMP) process) to level the top surfaces of contact plugs with the top surface of ILD 106.

Over ILD 106 and contact plugs resides interconnect structure 140. Interconnect structure 140 includes dielectric layers 142, and metal lines 144 and vias 146 formed in dielectric layers 142. Dielectric layers 142 are alternatively referred to as Inter-Metal Dielectric (IMD) layers 142 hereinafter. In accordance with some embodiments of the present disclosure, at least a lower layer in dielectric layers 142 is formed of a low-k dielectric material having a dielectric constant (k-value) lower than about 3.0 or lower than about 2.5. Dielectric layers 142 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 142 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 142 includes depositing a porogen-containing dielectric material, and then performing a curing process to drive out the porogen, and hence the remaining dielectric layers 142 becomes porous. Etch stop layers (not shown), which may be formed of silicon carbide, silicon nitride, or the like, are formed between IMD layers 142, and are not shown for simplicity.

Metal lines 144 and vias 146 are formed in dielectric layers 142. The metal lines 144 and vias 146 at a same level are collectively referred to as a metal layer hereinafter. In accordance with some embodiments of the present disclosure, interconnect structure 140 includes a plurality of metal layers that are interconnected through vias 146. Metal lines 144 and vias 146 may be formed of copper or copper alloys, and they can also be formed of other metals. The formation process may include single damascene and dual damascene processes. In an exemplary single damascene process, a trench is first formed in one of dielectric layers 142, followed by filling the trench with a conductive material. A planarization process such as a chemical mechanical polishing (CMP) process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like. In some embodiments, the semiconductor device package 100 may include a dielectric layer 132 formed over the interconnect structure 140 to insulate the interconnect structure 140 from structures formed over the interconnect structure 140. In some instances, the dielectric layer 132 may be formed of silicon nitride or other suitable material.

Still referring to FIG. 3, in some embodiments of the present disclosure, the semiconductor device package 100 may include a device 300 that are formed over the interconnect structure 140. As device 300 here refers to a device that does not have an active device, such as a transistor, device 300 may be referred to as a passive device 300. Because the device 300 is formed after the interconnect structure 140 is formed (or in some cases are form along with the interconnect structure 140), the device 300 can be said to be formed in far back end of line (FBEOL) process. FBEOL devices, such as devices 300, have advantages. For example, being formed in FBEOL steps allows a device 300 to have larger areas, which may be desirable for devices such as capacitors and antenna. Examples of the device 300 include metal-oxide-metal (MOM) capacitors, metal-insulator-metal (MIM) capacitors, super-high-density (SHD) MIM capacitors, SHD MOM capacitors, antennas, inductors, and transformers. In some implementations, the device 300 may be SHD MIM capacitor that includes a top electrode, a bottom electrode, and a plurality of middle electrodes. Between any two of these electrodes lies a dielectric layer. In some embodiments, the top electrode, the bottom electrode, and the plurality of middle electrode may be formed of a metal, such as copper, aluminum, an alloy thereof, or polysilicon. In these embodiments, the dielectric layers in the SHD MIM may be formed of silicon oxide, silicon nitride, metal oxide, metal nitride, or a combination thereof. As illustrated in FIG. 3, the device 300 is embedded in a dielectric layer 133, such as an undoped silicate glass (USG). The semiconductor device package 100 may include contact vias that electrically couple an electrode of the device 300, such as a bottom electrode, to the interconnect structure 140.

Still referring to FIG. 3, a contact pad 120 is formed over the dielectric layer 133 and is embedded in a passivation layer 134. It is noted, while the contact pad 120 in FIG. 3 is illustrated as a singular structure, the contact pad 120 may be a top contact layer or top metal layer of a redistribution structure (or RDL structure), which may include a plurality of redistribution layers (RDLs), each including a plurality of metal lines and vias formed in a RDL dielectric layer. The process for forming the RDL dielectric structure may be similar to the process forming the interconnect structure 140. The RDL dielectric layers may be formed of an oxide such as silicon oxide, a nitride such as silicon nitride, or the like. In some instances, there may be more than two layers of RDLs formed using single and/or dual damascene processes, which include etching the RDL dielectric layers to form via openings and trenches, depositing a conductive barrier layer into the openings, plating a metallic material such as copper or a copper alloy, and performing a planarization to remove the excess portions of the metallic material. There may be etch stop layers between RDL dielectric layers. In some embodiments, the contact pad 120 may be aluminum pads or aluminum-copper pads, and other metallic materials may be used. In some embodiments, the contact pad 120 or the RDL structure to which the contact pad 120 belong is electrically coupled to the device 300 through one or more contact vias that extend through the dielectric layer 133 and the passivation layer 134. In some implementations, such one or more contact vias are electrically coupled to a contact region or connector of the device 300.

The passivation layer 134 is formed over the contact pad 120 and a top RDL dielectric layer. The passivation layer 134 may be formed an undoped silica glass (USG) film using suitable deposition processes, such as high density plasma chemical vapor deposition (HDPCVD). An optional isolation layer 135 may be formed over the passivation layer 134 to shield stress from the passivation layer 134. The isolation layer 135 may be formed of silicon nitride and may be used to pattern the passivation layer 134. Thereafter, the isolation layer 135 and the passivation layer 134 is patterned to form a recess 138 to expose a portion of the contact pad 120. Then a polymeric passivation layer 136 may be formed over the isolation 135 and in the recess. In some implementations, the polymeric passivation layer 136 is formed over a sidewall of the isolation layer 135 and a sidewall of the passivation layer 134 in the recess 138. The polymeric passivation layer 136 may be formed of polyimide (PI), polybenzoxazole (PBO), or the like. Then the polymeric passivation layer 136 is patterned to form a recess 138 to expose a portion of the contact pad 120. In some embodiments, an anisotropic etchback process may be performed to recess the polymeric passivation layer 136 on a bottom surface of the recess 138 to expose a portion of the contact pad 120. The etchback process allows an overlying feature, such as an UBM feature, to form ohmic contact with the contact pad 120.

Still referring to FIG. 3, a UBM feature 110 is formed. The UBM feature 110 extends through the polymeric passivation layer 136 via the recess to electrically couple to the contact pad 120. In that regard, the UBM feature 110 includes an upper portion 110U and a lower portion 110L. The upper portion 110U is disposed over a top surface of the polymeric passivation layer 136. The lower portion 110L extends from the exposed portion of the contact pad 120 to around the top surface of the polymeric passivation layer 136. The lower portion 110L of the UBM feature 110 is disposed on sidewalls of the polymeric passivation layer 136 in the recess 138. In embodiments represented in FIG. 3, from a top view along the Z direction, the upper portion 110U has an area greater than an area of the lower portion 110L. In accordance with some embodiments of the present disclosure, the UBM feature 110 includes a barrier layer and a seed layer over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as aluminum, silver, gold, palladium, nickel, nickel alloys, tungsten alloys, chromium, chromium alloys, and combinations thereof may also be included in the UBM feature 110.

A bump feature 112 is then formed over the UBM feature 110. An exemplary formation process for forming the bump feature 112 includes depositing a blanket layer, forming and patterning a mask (which may be a photo resist), with portions of the blanket layer being exposed through the openings in the mask. After the formation of UBM feature 110, the semiconductor device package 100 is placed into a plating solution, and a plating step is performed to form a bump feature 112 on the UBM feature 110. In some embodiments, the bump feature 112 includes a conductive post that would not be molten in subsequent solder reflow process. The bump feature 112 (conductive post) may be formed of copper and may also include cap layer(s) selected from a nickel layer, a nickel alloy, a palladium layer, a gold layer, a silver layer, or multi-layers thereof. The cap layer(s) are formed over the copper bumps. In embodiments where the bump feature 112 includes copper, the bump feature 112 may be referred to as a copper post 112. A solder feature 114 is then formed over the bump feature 112. By use of a reflow process, the solder feature 114 allows the semiconductor device package 100 to electrically bond to another device or substrate.

Figure 4:
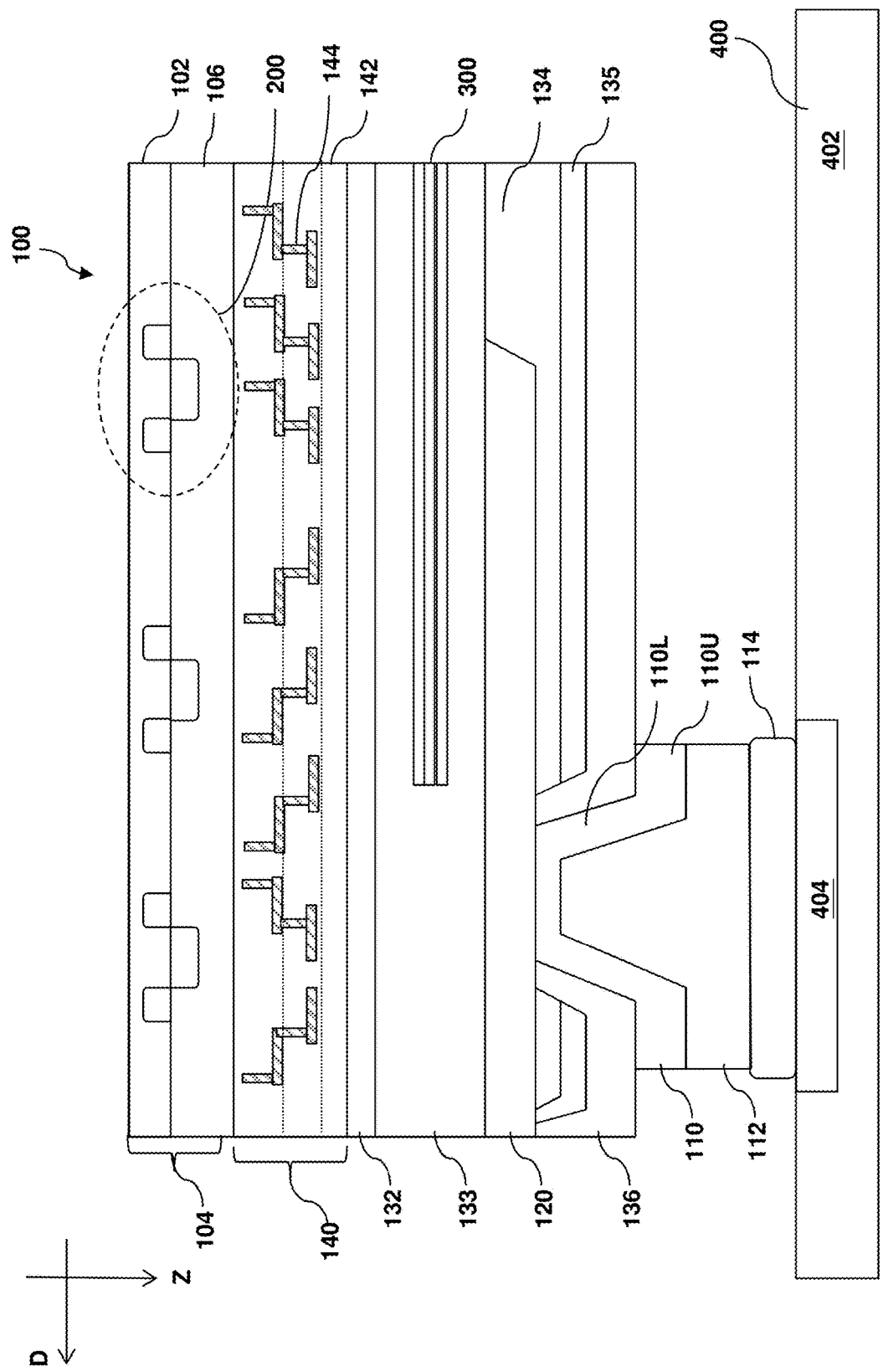
FIG. 4 is a cross-sectional view of the semiconductor device package of FIG. 2 along direction d-d' after the semiconductor device package is bonded to another substrate, according to various aspects of the present disclosure.

Referring now to FIG. 4, shown therein is the semiconductor device package 100 flipped over and bonded to another substrate 400. For ease of reference, the semiconductor substrate 102 may be referred to as the first substrate 102 and the another substrate 400 may be referred to as the second substrate 400. The second substrate 400 may be a semiconductor substrate, a polymeric substrate, a flexible substrate, or a printed circuit board (PCB). In some embodiments represented in FIG. 4, the second substrate 400 is a PCB that includes one or more copper layers laminated in a dielectric laminate. Example dielectric laminates include a polymer laminate, such as polyimide and PTFE or a polymer composite laminate, such FR-2 and FR-4. The PCB may be single-sided (copper layer on one side of the substrate), double-sided (copper layers on both sides of the substrate), or multi-layered (multiple copper layers). For illustration purpose, the second substrate 400 in FIG. 4 includes a connector pad 404 as part of the copper layer(s) laminated in a dielectric laminate 402. However, it is noted that the connector pad 404 maybe a part of a copper layer or a copper line that extends across a portion of the second substrate 400. Once the semiconductor device package 100 is flipped over and the solder feature 114 is aligned with the connector pad 404 of the second substrate 400, a solder reflow process is performed to reflow the solder feature 114 to electrically bond the semiconductor device package 100 to the second substrate 400, as illustrated in FIG. 4.

Figure 5:
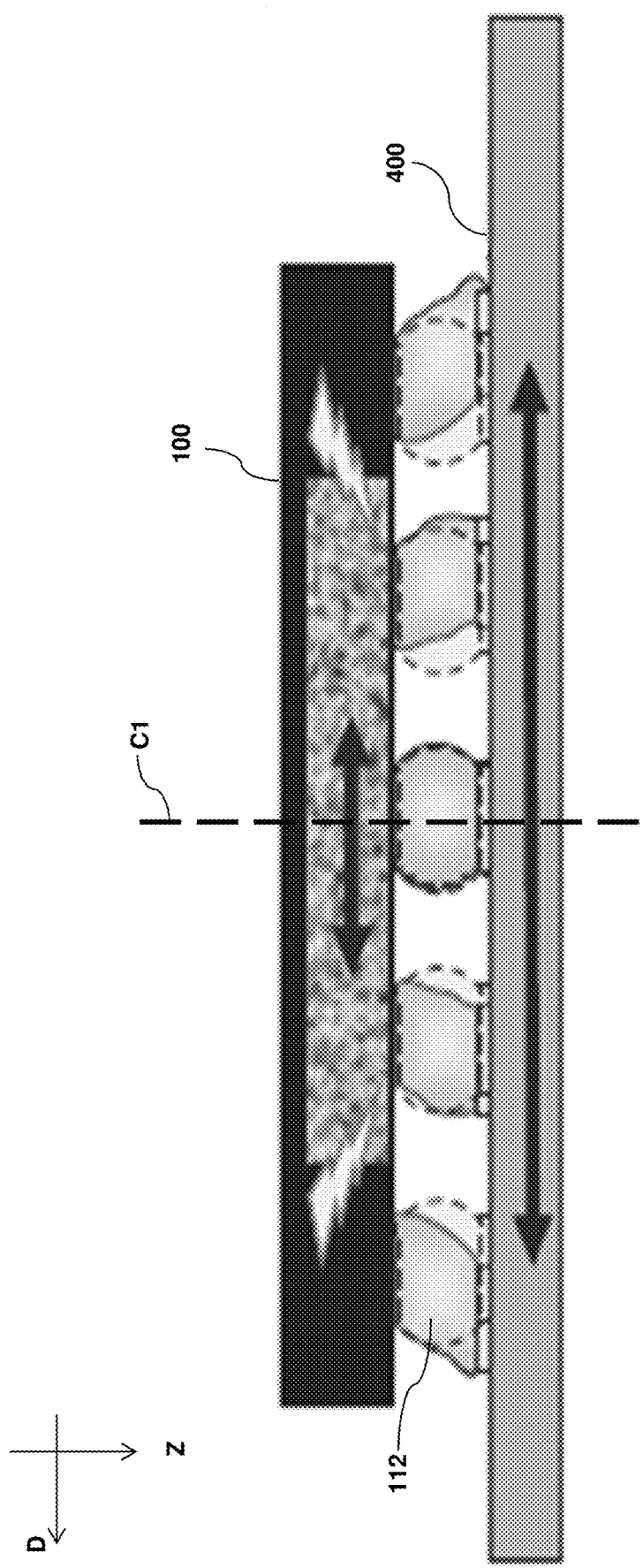
FIG. 5 is a schematic side view of a semiconductor device package bonded to another substrate.

Reference is now made to FIG. 5, which schematically illustrates the semiconductor device package 100 bonded to the second substrate 400 through a plurality of solder features similar to the solder feature 114. While five (5) bump features 112 are shown in FIG. 5 for ease of illustration, the semiconductor device package 100 may include more bump features 112. In some instances, the semiconductor device package 100 may have a coefficient of thermal expansion (CTE) lower than a CTE of the second substrate 400. The semiconductor device package 100 includes materials with low CTEs, such as the semiconductor substrate 102 and a plurality of oxide or nitride layers. In cases where the second substrate 400 is a PCB, the second substrate 400 includes materials with high CTEs (i.e. around 2 to 10 times higher than CTEs of the materials of the semiconductor device package 100), such as copper and a polymeric or polymer composite laminate. Because each of the first and second substrates includes a plurality of layers of materials, the CTEs as used herein refer to average or effective CTEs as exhibited by the first or the second substrate. When the semiconductor device package 100 is bonded to the second substrate 400 as shown in FIG. 5, the difference in the CTE between the semiconductor device package 100 and the second substrate 400 causes stress on the bump features 112 and strains the bump features 112 in thermal cycles. As the semiconductor device package 100 and the second substrate 400 undergo different expansion, the locational mismatch between the UBM feature 110 on the semiconductor device package 100 and the connector pad 404 on the second substrate 400 increases with distance from the center C1 of the semiconductor device package 100. The locational mistake translates into stress and the stress on the bump features therefore also increases with distance from the center C1. As shown in FIG. 5, the amount of strain in the bump features 112 also increases with distance from the center C1 of the semiconductor device package. Because bump features 112 at or around corners and edges of the semiconductor device package 100 are most spaced away from the center C1, they are stressed and strained the most.

Figure 6:
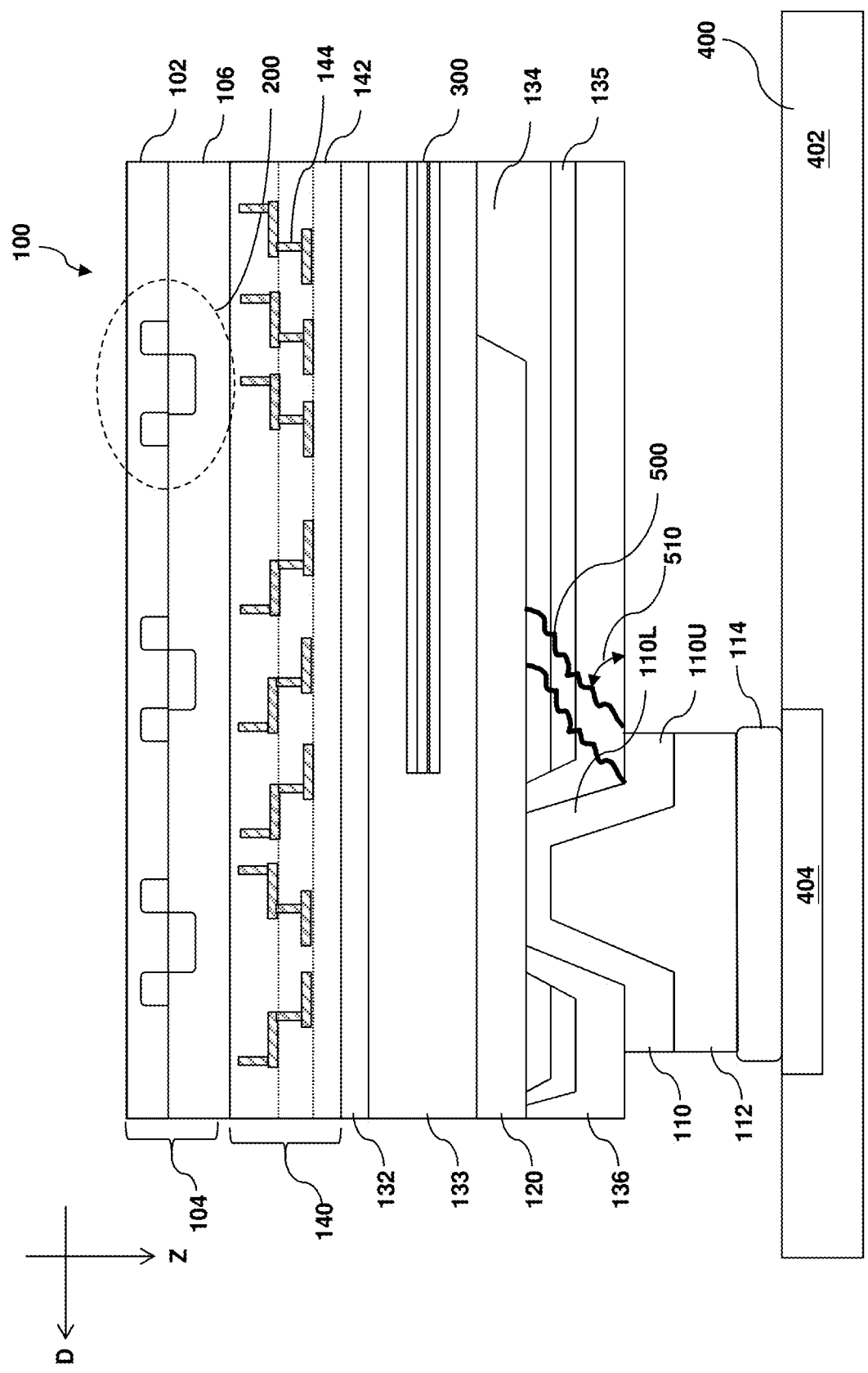
FIG. 6 is a cross-sectional view of the semiconductor device package of FIG. 2 along direction d-d' after the semiconductor device package is bonded to another substrate and undergoes thermal cycles, according to various aspects of the present disclosure.

Referring now to FIG. 6, illustrated therein is a cross-sectional view of the semiconductor device package 100 bonded to the second substrate 400. In some instances, the stress may be substantial enough to cause cracks 500 extending into the semiconductor device package 100 at an angle 510. In some instances, the angle 510 is between about 20 degrees and about 40 degrees. If the cracks 500 were not stopped, they may continue to penetrate the polymeric passivation layer 136, the isolation layer 135, the passivation layer 134, the dielectric layer 133 and reach the device 300. In cases where the device 300 is a SHD MIM capacitor, the cracks 500 may penetrate one or more layers of the SHD MIM capacitor. If the cracks 500 penetrate one of the electrodes and one of the dielectric layers of the SHD MIM, the fragment or traces of the penetrated electrode may lodge into cracks in the dielectric layer, causing a breakdown of the SHD MIM. As illustrated in FIG. 6, the contact pad 120 may be large enough to get in the propagation path of the cracks 500. Because the contact pad 120 is made with ductile metallic material such as aluminum or copper, the contact pad 120 may stop cracks 500 from propagating through the device 300. While the contact pad 120 may be made large enough to stop any of such cracks 500, a contact pad 120 may take up too much room and hinder meal line routing.

Figure 7:
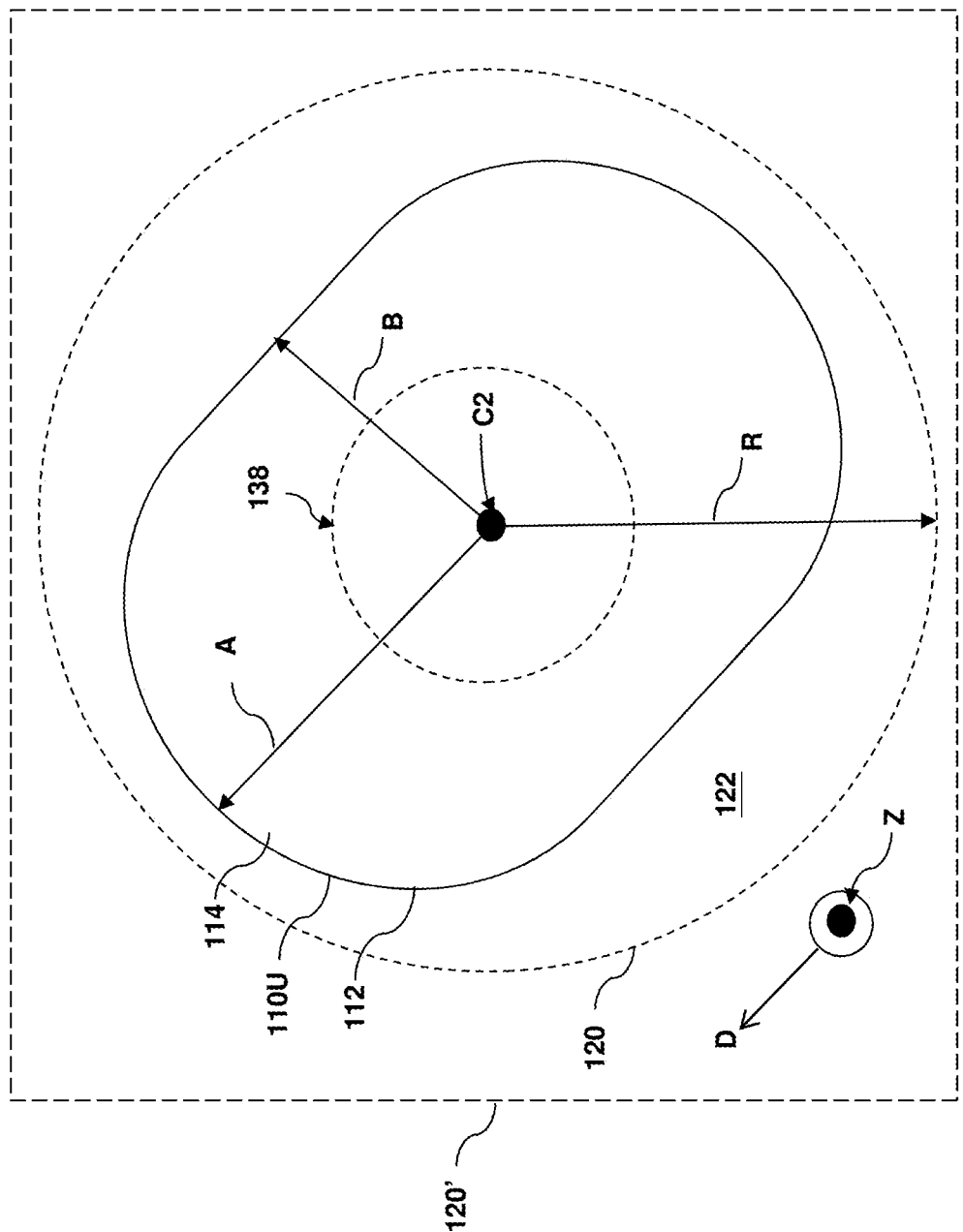
FIG. 7 is a top view of a bump feature of the semiconductor device package overlapped with projections of profiles of a recess and a contact pad, according to various aspects of the present disclosure.

The present disclosure provides a relationship between the contact pad 120 and the upper portion 110U such that the contact pad 120 is large enough to protect the device 300 but not too large to hinder metal line routing. Referring now to FIG. 7, illustrated therein is a top view of the upper portion 110U of the UBM feature 110 of the semiconductor device package 100 overlapped with projections of profiles of the recess 138 and the contact pad 120. Because the recess 138 and the contact pad 120 are not visible from a top view, they are shown in dotted lines. In some embodiments represented by FIG. 7, the profiles of the bump feature 112 and the solder feature 114 are substantially similar to that of the upper portion 110U of the UBM feature 110. In those embodiments, because the upper portion 110U shares the same shape of the solder feature 114, the upper portion 110U is illustrated in solid lines. According to embodiments of the present disclosure, a top-view projection (i.e. area) of the contact pad 120 is greater than a top-view projection (i.e. area) of the upper portion 110U. In at least some implementations of the present disclosure, the top-view projection of the upper portion 110U falls within the top view projection of the contact pad 120.

As shown in FIG. 7, the upper portion 110U takes the shape of a racetrack, a circle, an oval, or an ellipse with its major axis (i.e. the long axis) extending along the direction D. In some embodiments as shown in FIG. 7, the elliptical top-view profile of the upper portion 110U has a maximum radius (or semi-major axis) A, a minimum radius (or semi-minor axis) B, and a center C2. It is noted that, when the upper portion 110U is circular in shape, A equals B. In these embodiments, the recess 138 is circular or substantially circular. The recess 138 shares the center C2 with the top-view profile of the upper portion 110U. As shown in FIG. 7, the contact pad 120 has a circular area 122 within a surface area of the contact pad 120. The circular area 122 shares the center C2 and has a radius R. According to the present disclosure, the contact pad 120 may be circular, substantially circular, rectangular, or of other suitable top-view profile shape. In embodiments represented in FIG. 7, the contact pad 120 is circular and the surface area of the circular contact pad 120 may substantially coincide with the circular area 122 along its circumference such that the surface area of the circular contact pad 120 shares the radius R as well. In some other embodiments, the contact pad 120 may be rectangular (such as the contact pad 120' shown in FIG. 7) and the circular area 122 falls within the surface area of the rectangular contact pad 120'. In some embodiments of the present disclosure, the top-view profile of the upper portion 110U is smaller than and falls within the circular area 122, which is within the surface area of the contact pad 120. In some implementations, R is between one half of a summation of A and B (i.e. (A+B)/2) and a summation of A and B (i.e. (A+B)). When the contact pad 120 has a radius R within the aforementioned ranges, the embodiments of the present disclosure provide benefits. For example, the contact pad 120 is large enough to reduce stress exerted on device 300 around or under the contact pad 120 when the semiconductor device package 100 is bonded to the second substrate 400. The contact pad 120 is also large enough to prevent cracks 500 from propagating through the device 300, thereby preventing failure of the device 300. In addition, the contact pad 120 is not too large to hinder wire routing.

Figure 8:
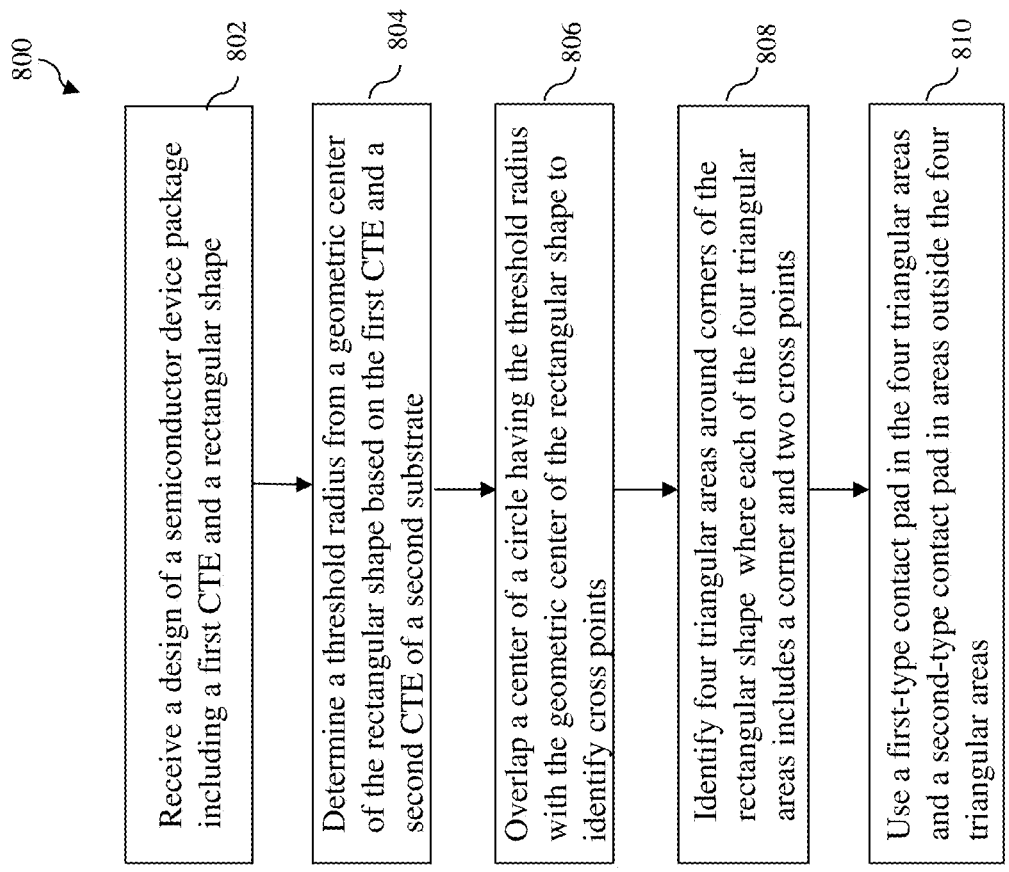
FIGS. 8 and 9 illustrate a method of determining a contact pad deployment in a semiconductor device package according to various aspects of the present disclosure.

As described above in conjunction with FIG. 5, when a low-CTE semiconductor device package, such as the semiconductor device package 100, is bonded to a high-CTE substrate, such as the second substrate 400, the amount of stress and strain on the bump feature 112 increases with distance from the center C1 of the semiconductor device package 100. In some embodiments, the amount of stress and strain on the bump feature 112 is greater when the size of the semiconductor device package 100 is larger. This stress enlargement or stress magnification is especially prominent when the area of the semiconductor device package is greater than 500 $mm^2$. In some implementations, the greater amount of stress and strain in a larger semiconductor device package 100 necessitates a greater number of bump features that are coupled to large contact pads to reduce stress and to prevent cracks from reaching the device 300 that are disposed around or under the UBM feature 110. FIG. 8 illustrates a method 800 of determining a contact pad deployment in a semiconductor device package according to various aspects of the present disclosure. The method 800 is suitable for semiconductor device package of all sizes. The method 800 is merely an example, and is not intended to limit the present disclosure beyond what is explicitly recited in the claims. Additional operations can be provided before, during, and after the method 800, and some operations described can be replaced, eliminated, or moved around for additional embodiments of the method 800. Operations 802, 804, 806, 808, and 810 of the method 800 will be described below in conjunction with FIGS. 6 and 9.

The method 800 in FIG. 8 starts with an operation 802 to receive a design of a semiconductor device package that includes a first CTE and a rectangular shape. At operation 802, a design of a semiconductor device package such as the semiconductor device package 100 is received. The semiconductor device package 100 has a rectangular shape and a first CTE, which is largely governed by the low CTEs of the semiconductor substrate 102, oxide layers and nitride layers.

At operation 804, a threshold radius (TR, shown in FIG. 9) from a geometric center C1 of the rectangular shape of the semiconductor device package 100 is determined based on the first CTE and a second CTE of a second substrate. As described above, the first CTE of the semiconductor device package 100 may be lower than the second substrate 400 when the second substrate is, for example, a PCB, which is formed of copper layer(s) and polymer/polymer composite laminate. The difference between the first and second CTEs may result in increasingly large stress as distance from the center C1 increases. Through test or simulation, the threshold radius TR can be determined such that bump features within the threshold radius TR fall below a certain value. In some embodiments, the determination of the threshold radius TR is based on the difference between the first CTE and the second CTE such that stress on bump features within the threshold radius is below a threshold stress value and stress on bump features beyond the threshold radius is above the threshold stress value. In some other embodiments, the determination of the threshold radius TR is also based on routing needs in the RDL layer where the contact pad 120 rests. In some further embodiments, the determination of the threshold radius TR is further based on the angle at which the crack (such as cracks 500) propagates from or around the UBM feature 110. For example, cracks propagating from or around the UBM feature 110 at a shallow angle (angles less than 20 degrees) may only be stopped by a larger contact pad 120 and such a larger contact pad 120 may hinder routing. In this regard, the threshold radius TR is determined such that cracks do not propagate at such shallow angles.

Figure 9:
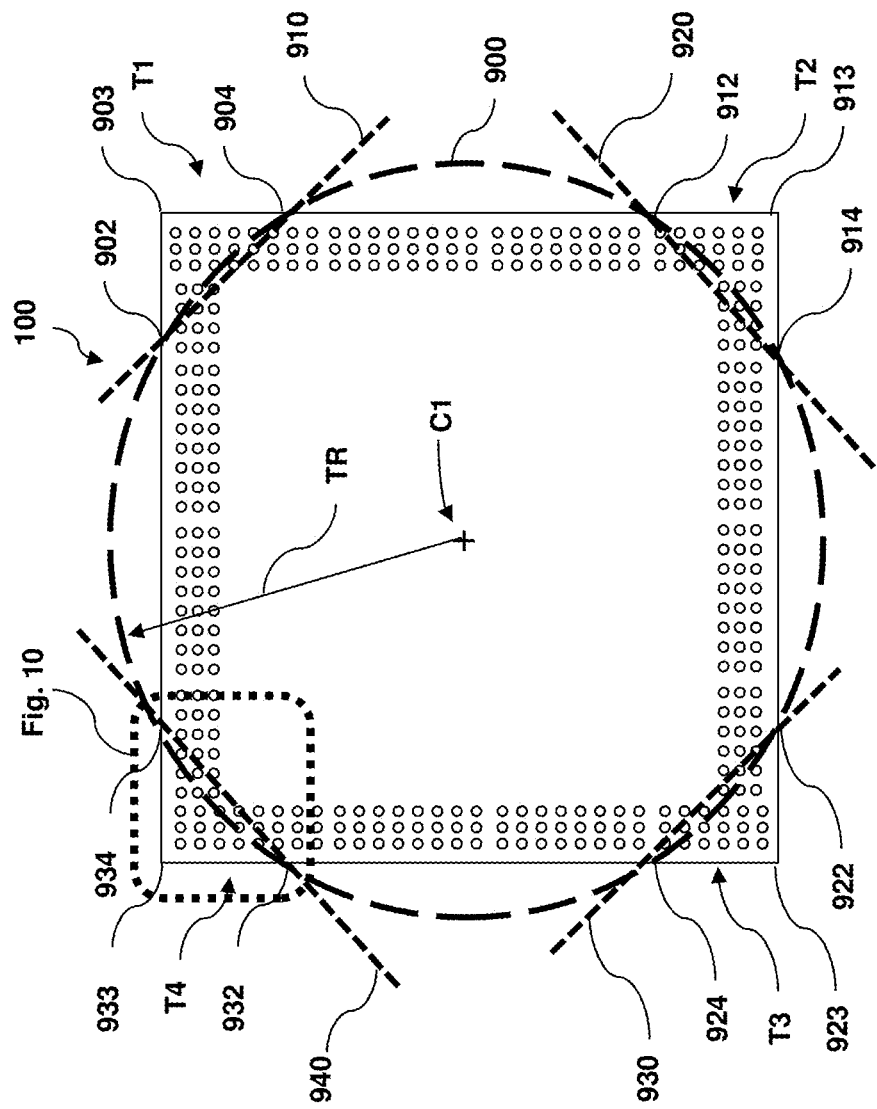

At operation 806, a center of a circle 900 having the threshold radius (TR) is overlapped with the geometric center C1 of the rectangular shape of the semiconductor device package 100 to identify cross points 902, 904, 912, 914, 922, 924, 932, and 934 between the circle and the rectangular shape. As shown in FIG. 9, the center of the circle 900 overlaps or coincides with the center C1 and is not separately labeled. The amount of stress on bump features within the circle 900 is smaller than the amount of stress on bump features outside the circle 900.

The method 800 may proceed to an operation 808. At operation 808, four triangular areas around corners of the rectangular shape are identified. Each of the four triangular areas includes a corner and two cross points. As shown in FIG. 9, the corner 903 and the two cross points 902 and 904 constitute a first triangle T1; the corner 913 and the two cross points 912 and 914 constitute a second triangle T2; the corner 923 and the two cross points 922 and 924 constitute a third triangle T3; and the corner 933 and the two cross points 932 and 934 constitute a fourth triangle T4. The four triangular areas T1-T4 approximate the areas of the semiconductor device package 100 outside the circle 900. Cross point pairs 902 and 904, 912 and 914, 922 and 924, and 932 and 934 define four secant lines 910, 920, 930 and 940 that cut through a portion of the circular shape 900. That is, the four triangular areas T1-T4 are overly inclusive to include an area that fall within the circular shape 900. The overly inclusive triangular areas serve as a safety margin built in the method 800.

Then at operation 810, a first-type contact pad is used in four triangular areas T1-T4 and a second-type contact pad is used in areas outside the four triangular areas T1-T4. Here, the first-type contact pad is identical to the contact pad 120 described in FIG. 7 above, wherein top-view profile of the upper portion 110U is smaller than and falls within the top-view profile of the contact pad 120. In some embodiments, the first-type contact pad has a radius R and the upper portion 110U includes a maximum radius A and a minimum radius B; and R is between one half of the summation of A and B ((A+B)/2) and the summation of A and B (A+B). The second-type contact pad is different from the first-type contact pad. In some embodiments, the second-type contact pad is one whose top-view profile is smaller than the top-view profile of the upper portion 110U of the UBM feature 110. In some embodiments, at least a portion of the top-view profile of the upper portion 110U falls outside the top-view profile of the second-type contact pad. While the second-type contact pad may not provide as much stress relief or crack shielding as the first-type contact pad, its smaller footprint may make more room for wire routing. By using method 800 of the present disclosure, the first-type contact pad may be placed where stress relief/crack shielding is needed while the second-type contact pad may be placed where stress relief/crack shielding is less needed.

A corner of the semiconductor device package 100 that includes the fourth triangular area T4 in FIG. 9 is enlarged and illustrated in FIG. 10. In some embodiments, after the four triangular areas T1 through T4 are determined using method 800, a plurality of first-type contact pads 120-1 is used and disposed in the four triangular areas T1 to T4 and a plurality of second-type contact pads 120-2 is used and disposed in areas other than the four triangular areas T1 to T4. Both the first-type contact pads 120-1 and the second-type contact pads 120-2 may be rectangular or circular in shape. In embodiments represented in FIG. 10, both the first-type contact pads 120-1 and the second-type contact pads 120-2 are substantially circular in shape. In these embodiments, the first-type contact pads 120-1 is similar to the contact pad 120 described in FIG. 7 above, wherein top-view profile of the upper portion 110U is smaller than and falls within the top-view profile of the contact pad 120. The first-type contact pad 120-1 has a radius R and the upper portion 110U (not shown in FIG. 10) includes a maximum radius A and a minimum radius B; and R is between one half of the summation of A and B ((A+B)/2) and the summation of A and B (A+B). The second-type contact pad 120-2 is different from the first-type contact pad 120-1 as well as the contact pad 120 described in FIG. 7 at least in terms of dimensions. In some instances, the first-type contact pad 120-1 has a larger area or has a larger footprint than that of the second-type contact pad 120-2. The first-type contact pads 120-1 are disposed at a pitch P1 and the second contact pads 120-2 are disposed at a pitch P2. In some implementations where the first-type contact pads 120-1 can be deployed with sufficient spacing among first-type contact pads 120-1, the pitch P1 may be substantially identical to the pitch P2. In some alternative implementations where the locations of the first-type contact pads 120-1 have to be rearranged to ensure sufficient spacing among the first-type contact pads 120-1, the pitch P1 may be greater than the pitch P2.

In one embodiment, the present disclosure provides a semiconductor device package. The semiconductor device package includes a substrate including a first region, a passive device disposed over the first region of the substrate, a contact pad disposed over the passive device, a passivation layer disposed over the contact pad, a recess through the passivation layer, and an under-bump metallization (UBM) layer. The recess exposes the contact pad and the UBM layer includes an upper portion disposed over the passivation layer and a lower portion disposed over a sidewall of the recess. A projection of the upper portion of the UBM layer along a direction perpendicular to the substrate falls within an area of the contact pad.

In some embodiments, the first region is around an edge of the semiconductor device package. In some implementations, the passive device includes a metal-insulator-metal (MIM) capacitor or a metal-oxide-metal (MOM) capacitor. In some instances, the contact pad includes a circular area within a surface area of the contact pad and the circular area has a radius R; the upper portion includes a maximum radius A and a minimum radius B; and R is between one half of a sum of A and B ((A+B)/2) and the sum of A and B (A+B). In some embodiments, the contact pad comprises aluminum, copper or a combination thereof. In some embodiments, the upper portion of the UBM layer includes an oval shape, a circular shape, or a shape of a race track. In some implementations, the contact pad is substantially circular. In some instances, the semiconductor device package of the present disclosure further includes a redistribution layer (RDL) and the RDL includes the contact pad.

In another embodiment, the present disclosure also provides a device. The device includes a semiconductor device package and a second substrate including a connector pad. The semiconductor device package includes a first substrate including a first region, a passive device disposed over the first region of the first substrate, a contact pad disposed over the passive device, a passivation layer disposed over the contact pad, a recess through the passivation layer, an under bump metallization (UBM) layer, the UBM layer including an upper portion disposed over the passivation layer and a lower portion disposed over a sidewall of the recess, and a bump feature disposed over the UBM layer. The contact pad includes a circular area within a surface area of the contact pad. The recess exposes the contact pad. The bump feature of the semiconductor device package is bonded to the connector pad of the second substrate such that the contact pad is electrically coupled to the connector pad. A projection of the upper portion of the UBM layer along a direction perpendicular to the first substrate falls within the circular area within the surface area of the contact pad.

In some embodiments, the circular area includes a radius R; the upper portion includes a maximum radius A and a minimum radius B; and R is between one half of a sum of A and B ((A+B)/2) and the sum of A and B (A+B). In some embodiments, the first region is around an edge of the semiconductor device package. In some instances, the passive device includes a metal-insulator-metal (MIM) capacitor or a metal-oxide-metal (MOM) capacitor. In some embodiments, the second substrate includes a printed circuit board (PCB). In some implementations, the second substrate includes a coefficient of thermal expansion (CTE) greater than a CTE of the semiconductor device package. In some instances, the contact pad is substantially circular. In some embodiments, the semiconductor device package further includes a redistribution layer (RDL) and the RDL includes the contact pad.

In yet another embodiment, the present disclosure provides a semiconductor device package that includes a substrate including an edge region, a contact pad disposed over the edge region, an under-bump metallization (UBM) layer, and a passive device. The UBM layer includes a lower portion disposed on the contact pad and an upper portion larger than the lower portion in terms of area. At least a portion of the passive device is disposed between the contact pad and the substrate. A projection of the upper portion of the UBM layer along a direction perpendicular to the substrate falls within an area of the contact pad.

In some embodiments, the passive device includes a metal-insulator-metal (MIM) capacitor or a metal-oxide-metal (MOM) capacitor. In some implementations, the contact pad includes a circular area within a surface area of the contact pad, the circular area having a radius R; the upper portion includes a maximum radius A and a minimum radius B, and R is between one half of a sum of A and B ((A+B)/2) and the sum of A and B (A+B). In some instances, the semiconductor device package may further include a redistribution layer (RDL) and the RDL includes the contact pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   receiving a design of a device package including a first coefficient of thermal expansion (CTE);
   determining a threshold radius from a geometric center of the device package based on the first CTE and a second CTE of a substrate;
   overlapping a center of a circle having the threshold radius with the geometric center to identify a first area of the device package outside of the circle and a second area of the device package within the circle;
   fabricating a first-type contact pad in the first area; and
   fabricating a second-type contact pad in the second area.

2. The method of claim 1, wherein the first CTE is smaller than the second CTE.

3. The method of claim 1,
   wherein the design of the device package includes a plurality of bump features,
   wherein first stresses on a first portion of the plurality of bump features within the threshold radius is below a threshold stress level, and
   wherein second stresses on a second portion of the plurality of bump features outside the threshold radius is above the threshold stress level.

4. The method of claim 3, wherein each of the plurality of bump features comprises a racetrack shape or an oval shape that includes a long axis pointing toward the geometric center.

5. The method of claim 1,
wherein the design of the device package comprises a rectangular shape
wherein the overlapping comprises identifying a plurality of cross points between the circle and the rectangular shape.

6. The method of claim 5,
wherein the rectangular shape comprises:
a first corner,
a second corner,
a third corner, and
a fourth corner,
wherein the plurality of cross points include:
a first cross point and a second cross point adjacent the first corner,
a third cross point and a fourth cross point adjacent the second corner,
a fifth cross point and a sixth cross point adjacent the third corner, and
a seventh cross point and an eighth cross point adjacent the fourth corner.

7. The method of claim 6, wherein the first area comprises:
a first triangular area defined by the first cross point, the second cross point, and the first corner;
a second triangular area defined by the third cross point, the fourth cross point, and the second corner;
a third triangular area defined by the fifth cross point, the sixth cross point, and the third corner; and
a fourth triangular area defined by the seventh cross point, the eighth cross point, and the fourth corner.

8. The method of claim 7, wherein the second area comprises an area of the rectangular shape other than the first triangular area, the second triangular area, the third triangular area, and the fourth triangular area.

9. The method of claim 1, wherein a portion of a projection of a bumper feature directly over the of the second-type contact pad along a vertical direction falls outside of an area of the second-type contact pad.

10. The method of claim 1,
wherein the first-type contact pad includes a circular area within a surface area of the first-type contact pad, the circular area having a radius R,
wherein a bumper feature directly over the first-type contact pad comprises a maximum radius A and a minimum radius B,
wherein R is between one half of a sum of A and B ((A+B)/2) and the sum of A and B (A+B).

11. A method, comprising:
receiving a design of a device package to be bonded to a substrate, wherein the device package includes a rectangular shape and the rectangular shape includes a geometric center;
determining a threshold radius from the geometric center based on a difference between a first coefficient of thermal expansion (CTE) coefficient of the device package and a second CTE of the substrate;
positioning a circle having the threshold radius over the device package such that a center of the circle coincides with the geometric center;
using a first-type contact pad in a first area of the device package outside the circle; and
using a second-type contact pad in a second area of the device package outside the circle.

12. The method of claim 11, wherein the device package comprises silicon, silicon oxide, or silicon nitride.

13. The method of claim 11, wherein the substrate comprises copper and a polymer composite laminate.

14. The method of claim 11, wherein the second CTE is between about 2 times and about 10 times of the first CTE.

15. The method of claim 11, wherein a portion of a projection of a bumper feature directly over the of the second-type contact pad along a vertical direction falls outside of an area of the second-type contact pad.

16. The method of claim 11,
wherein the first-type contact pad includes a circular area within a surface area of the first-type contact pad, the circular area having a radius R,
wherein a bumper feature directly over the first-type contact pad comprises a maximum radius A and a minimum radius B,
wherein R is between one half of a sum of A and B ((A+B)/2) and the sum of A and B (A+B).

17. The method of claim 16, wherein the bumper feature comprises an oval shape, a circular shape, or a shape of a race track.

18. A method, comprising:
receiving a design of a device package including a first coefficient of thermal expansion (CTE) and a rectangular shape, wherein the rectangular shape comprises a first corner, a second corner, a third corner, and a fourth corner;
determining a threshold radius from a geometric center of the rectangular shape based on a difference between the first CTE and a second CTE of a substrate;
overlapping a center of a circle having the threshold radius with the geometric center to identify a first cross point and a second cross point adjacent the first corner, a third cross point and a fourth cross point adjacent the second corner, a fifth cross point and a sixth cross point adjacent the third corner, and a seventh cross point and an eighth cross point adjacent the fourth corner, wherein the first cross point, the second cross point, and the first corner define a first triangular area, the third cross point, the fourth cross point, and the second corner defines a second triangular area, the fifth cross point, the sixth cross point, and the third corner define a third triangular area, and the seventh cross point, the eighth cross point, and the fourth corner define a fourth triangular area;
using a first-type contact pad in the first triangular area, the second triangular area, the third triangular area, and the fourth triangular area; and
using a second-type contact pad in an area of the device package other than the first triangular area, the second triangular area, the third triangular area, and the fourth triangular area.

19. The method of claim 18, wherein a portion of a projection of a bumper feature directly over the of the second-type contact pad along a vertical direction falls outside of an area of the second-type contact pad.

20. The method of claim 18,
wherein the first-type contact pad includes a circular area within a surface area of the first-type contact pad, the circular area having a radius R,
wherein a bumper feature directly over the first-type contact pad comprises a maximum radius A and a minimum radius B,
wherein R is between one half of a sum of A and B ((A+B)/2) and the sum of A and B (A+B).

\* \* \* \* \*